(12) United States Patent
Aygun et al.

(10) Patent No.: US 10,303,225 B2
(45) Date of Patent: May 28, 2019

(54) METHODS OF FORMING HYBRID SOCKET STRUCTURES FOR PACKAGE INTERCONNECT APPLICATIONS AND STRUCTURES FORMED THEREBY

(71) Applicant: Intel Corporation, Santa Clara, CA (US)

(72) Inventors: Kemal Aygun, Tempe, AZ (US);
Zhichao Zhang, Chandler, AZ (US);
Cemil Geyik, Chandler, AZ (US);
Guneet Kaur, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/720,484

(22) Filed: Sep. 29, 2017

(65) Prior Publication Data

US 2019/0101961 A1 Apr. 4, 2019

(51) Int. Cl.
*H01L 23/02* (2006.01)
*G06F 1/18* (2006.01)
*H05K 3/40* (2006.01)
*H01R 13/10* (2006.01)
*H05K 7/14* (2006.01)

(52) U.S. Cl.
CPC ............. *G06F 1/185* (2013.01); *H01R 13/10* (2013.01); *H05K 3/4038* (2013.01); *H05K 7/1409* (2013.01)

(58) Field of Classification Search
CPC ...... G06F 1/185; H01R 13/10; H05K 3/4038; H05K 7/1409
USPC ........................................................ 257/686
See application file for complete search history.

(56) References Cited

U.S. PATENT DOCUMENTS

| 9,331,370 | B1 * | 5/2016 | Jiang | ........................ H01P 3/081 |
| 2004/0051173 | A1 * | 3/2004 | Koh | .......................... H01L 24/11 257/728 |
| 2012/0131253 | A1 * | 5/2012 | McKnight | ................. G06F 1/30 710/308 |
| 2013/0242493 | A1 * | 9/2013 | Shenoy | ............. H01L 23/49827 361/679.21 |
| 2015/0279768 | A1 * | 10/2015 | Rathburn | ...................... 174/251 |
| 2017/0194721 | A1 * | 7/2017 | Fan | .......................... H01R 4/04 |

* cited by examiner

*Primary Examiner* — Tu-Tu V Ho
(74) *Attorney, Agent, or Firm* — Green, Howard & Mughal LLP.

(57) ABSTRACT

Methods/structures of forming package structures are described. Those methods/structures may include a conductive pin comprising: a cantilever beam portion physically coupled with a first side of a package substrate; a contact pin portion, wherein a terminal end of the contact pin portion is physically and electrically coupled to a board; a housing structure comprising a housing cavity, wherein the contact pin portion is disposed at least partially within the housing cavity; and a conductive material disposed on housing sides and/or adjacent a surface of the housing cavity. The placement of the conductive material is optimized to meet the requirements for either double data rate (DDR) and/or peripheral component interface express (PCIe) interfaces.

25 Claims, 6 Drawing Sheets

METHODS OF FORMING HYBRID SOCKET STRUCTURES FOR PACKAGE INTERCONNECT APPLICATIONS AND STRUCTURES FORMED THEREBY

BACKGROUND

As bandwidth demands for future generations of dynamic data rate (DDR) memory and peripheral component interconnect express (PCIe) technology increase, improved design of the individual components of input/output (I/O) channels to meet the desired electrical performance specifications is required. A socket that interconnects a microelectronic package to a motherboard, for example, may significantly contribute to channel loss and cross talk, thereby limiting channel margin at higher speeds. Thus, improving socket design enables interconnect technology for future high speed DDR and PCIe links.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
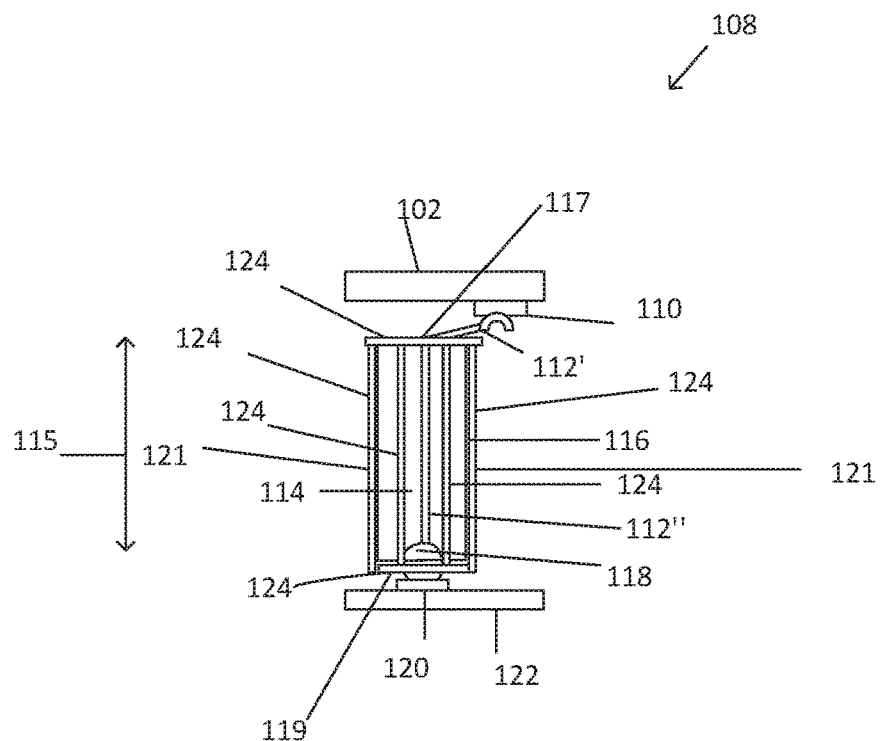
FIG. 1a represents a cross-sectional view of a socket structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the die may comprise a microprocessor, a graphics processor, a signal processor, a network processor, a chipset, etc. In one embodiment, a die may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on a die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

For example, the terminals on a substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter a reflow temperature).

Embodiments of methods of forming packaging structures, such as methods of forming hybrid socket structures comprising a geometrically optimized structure for reduced cross talk for single-ended 10 and matched impedance for differential-ended 10 applications, are described. Those methods/structures may include a conductive pin comprising: a cantilever beam portion physically coupled with a first side of a package substrate; a contact pin portion, wherein a terminal end of the contact pin portion is physically and electrically coupled to a board; a housing structure comprising a housing cavity, wherein the contact pin portion is disposed at least partially within the housing cavity; and a conductive material that is disposed on housing sides and/or adjacent a surface of the housing cavity. The conductive material may be selectively tailored/added to meet the requirements for either DDR and/or PCIe interfaces.

The methods/structures herein may use the same socket design for both single-ended and differential-ended I/O applications. In an embodiment, a socket design of the embodiments herein can first be optimized for a single-ended channel application by primarily focusing on cross-talk mitigation, followed by introducing an additional amount of metal inside and/or around a socket housing structure. This additional metal shielding lowers an impedance discontinuity for meeting the electrical targets for the differential-ended channels.

Since DDR and PCI technology are ever developing, bandwidth demands require improved I/O channel performance to reduce channel loss as well as to reduce cross talk in order to improve socket performance and margin at higher speeds. The DDR channel margins tend to exhibit more issues related to crosstalk between neighboring nets, whereas, the PCIe channel margins tend to be more greatly affected by impedance mismatch. The hybrid socket design of the embodiments herein enable interconnect technology for future high speed DDR and PCIe link applications. The embodiments herein enable a single socket technology for both DDR and PCIe signaling simultaneously, for example.

FIG. 1a depicts a portion of a socket array structure, wherein an individual socket structure 108 is depicted. The socket structure 108 may comprise a portion of a land grid array (LGA) socket, for example. The socket structure 108 may comprise a conductive pin 112, which may comprise a cantilever beam portion 112' and a contact pin portion 112". The conductive pin 112, may comprise a conductive material such as copper and copper alloys, for example. The contact pin portion 112" of the conductive pin 112 may be disposed within a housing structure 116 (shown as a portion of a housing structure 116), which may comprise a first side 117, a second side opposite the first side 119, and sidewalls 121. The housing structure 116 may further comprise a height 115 which may be optimized to reduce socket pin to pin cross talk, as well as lowering the socket 108 inductance and capacitance.

The housing structure 116 may comprise a dielectric material, such as a material comprising a high permittivity and a low loss, such as dielectric materials from the family of liquid crystal polymer (LCP) materials. In an embodiment, the housing structure 116 may further comprise a housing cavity 114, wherein the contact pin portion 112" of the conductive pin 112 may be disposed within the housing cavity 114 of the housing structure 116. In an embodiment, a conductive material/plating 124 may be disposed adjacent and/or on a surface of the housing cavity 114. In an embodiment, the conductive material/plating 124 may comprise a copper material, and may comprise a conductive via adjacent the housing cavity 114. In an embodiment, the housing cavity 114 may comprise any suitable dielectric material within the cavity, such as a dielectric material comprising high permittivity and low dielectric loss, such as any suitable LCP material, for example, such as Kevlar, vectran or Zenite, for example.

In an embodiment, the conductive material plating 124, which may comprise any suitable conductive material, such as copper for example, may further be disposed on the first side 117 of the housing 116 and/or on the bottom side 119 of the housing 116. In another embodiment, the conductive material/plating 124 may be disposed throughout or on portions of sidewalls 121 of the housing structure 116. The conductive plating 124 may be formed, for example, by drilling through holes in the housing dielectric material around/adjacent the socket housing cavity, and subsequently plating the conductive material 124 within the through holes, in an embodiment. Any other suitable process may be employed to form the conductive material 124 in the required locations for the particular socket design optimization.

The conductive material/plating 124 may serve to optimize performance of a system employing the socket structure 108, such as a system including PCIe and/or DDR devices/structures, which may comprise high speed single ended and/or differential ended interconnect structures. The socket 108 may be configured to optimize signal impedance and cross talk specifications for DDR and PCIe applications by optimizing various structural features of the socket 108.

In an embodiment, the cantilever beam 112' may be widened to lower the impedance of the socket 108, and the addition of the metal plating 124 around the housing and housing cavity may be utilized to reduce socket impedance as well. In an embodiment, the cantilever beam portion 112' may be physically and electrically coupled to a conductive pad 110 disposed on a package substrate 102. In another embodiment, a terminal end of the contact pin portion 112" may be physically and electrically coupled to solder structure 118, such as a solder ball. The solder structure 118 may be coupled to a board 122, such as a motherboard, for example.

Figure 1B:
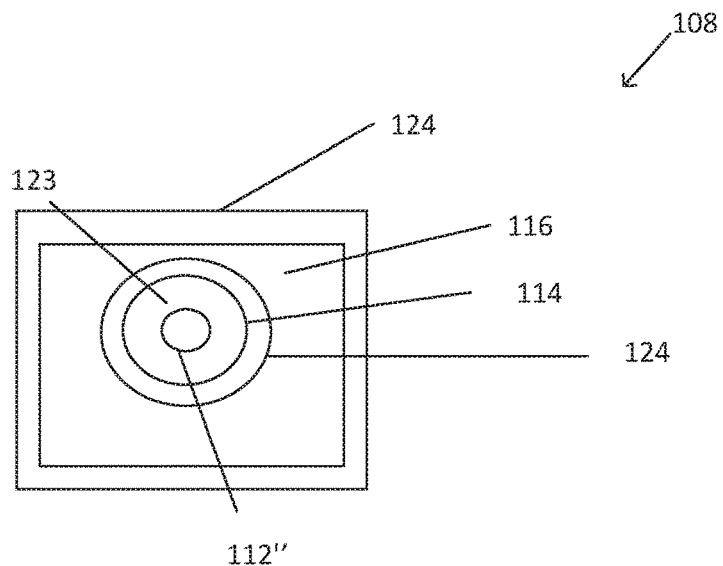
FIG. 1b represents a top view of a socket structure according to embodiments.

FIG. 1b is a top view of a portion of a socket structure 108, such as the socket structure 108 of FIG. 1b. A contact pin portion 112" of the conductive pin may be disposed within a housing cavity 114. The housing cavity may comprise a dielectric 123 material adjacent the contact pin 112", that may comprise a low loss, high permittivity dielectric material. A conductive material/plating 124 may be disposed on a surface of the housing cavity 114, according to the particular design optimization requirements. A housing structure 116 may be adjacent the housing cavity 114, and a conductive material plating 124 may be disposed on the housing structure 116, according to design optimization requirements.

Figure 2:
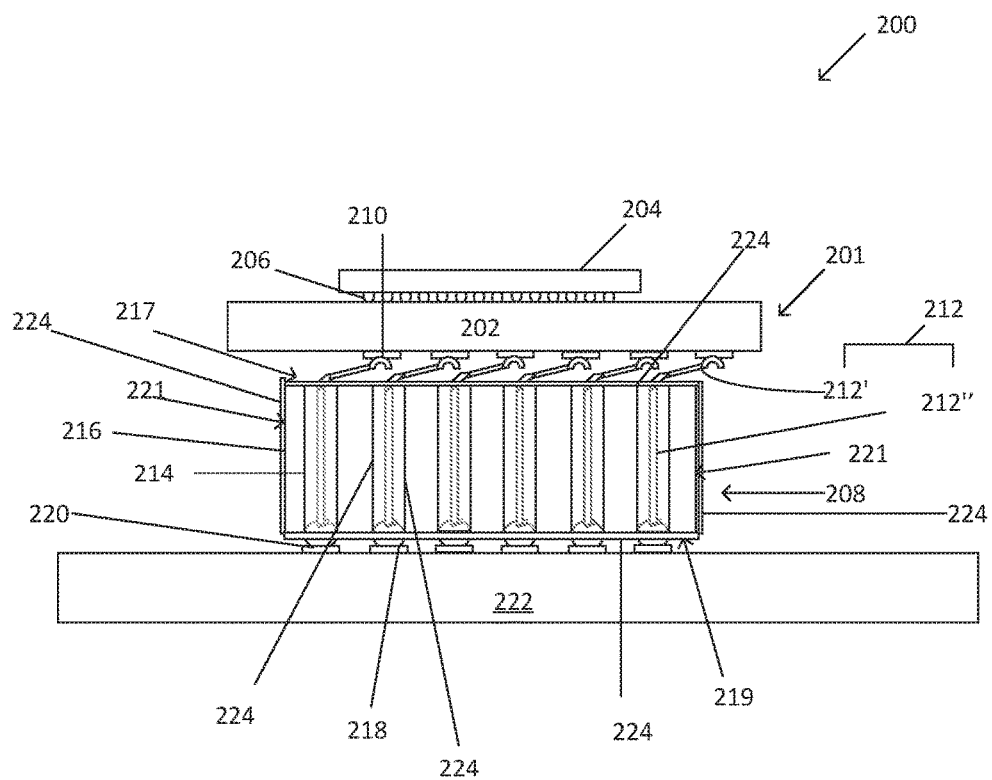
FIG. 2 represents a cross-sectional view of a package structure according to embodiments.

FIG. 2 depicts a cross sectional view of a package structure/assembly 200, which includes a plurality of socket structures 208, such as the optimized socket structure 108 of FIG. 1*a*, for example. The plurality of sockets 208 may be disposed between a package substrate 202 and a board 222. In an embodiment, the plurality of sockets 208 may be disposed within a housing structure 216. The housing structure 216 may comprise a plurality of housing cavities 214, wherein individual contact pin portions 212" of a conductive pin 212 may be disposed within individual housing cavities 214.

Terminal ends of the contact pin portions 212" may be physically coupled to solder ball structures 218 that may be coupled with conductive pads 220 disposed on a board 222, such as a motherboard 222. The individual conductive pins 212 may further comprise a cantilever beam portion 212' that may be physically coupled with conductive pads 210 disposed on the package substrate 202. A conductive material 224 may be disposed on a first side 217 and/or on a second side 219, and/or on sidewalls 217 of the housing structure 116, and may be disposed along the entire sidewall in an embodiment. In another embodiment, conductive material 224 may be disposed on surfaces of the housing cavity 214, and may be disposed between adjacent or non-adjacent housing cavity structures/sidewalls. The particular amounts and placement/location of the conductive materials/plating 224, which may comprise copper, for example, that may be formed/disposed on the housing cavity and/or surfaces of the housing structure, may vary depending upon the particular electrical parameters required for optimization for a particular application. In an embodiment, the conductive material 224 may comprise a thickness of between about 5 microns to about 10 microns. In an embodiment, the conductive material 224 may extend along the full height of the housing structure 216, as well as along substantially the entire length of the first and second sides of the housing structure 216.

The substrate 202 may be coupled with at least one die/device 204 by utilizing a plurality of conductive interconnect structures 206. The at least one die/device 204 may comprise any number of die stacked upon each other, or may comprise a device including any number of die comprising an array of functionality. In an embodiment, at least one of the at least one die 204 may comprise a dynamic random access memory (DRAM) memory die, and may comprise a double data rate (DDR) die, such as a DDR4 die, and/or a DDR5 die, for example.

The board 222 may comprise any suitable type of circuit board or other substrate capable of providing electrical communication between one or more of the various components disposed on the board 222. In one embodiment, for example, the board 222 may comprise a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 222. However, it should be understood that the disclosed embodiments are not limited to the above-described PCB and, further, that board 222 may comprise any other suitable substrate.

According to one embodiment, package assembly 200 includes one or more processing systems and includes one or more memory devices. In another embodiment, the package assembly 200 includes one or more processing systems, and may comprise a wireless communications system (or, alternatively, includes one or more components of a communications system). In an embodiment, the package assembly 200 includes a graphics processing system. The assembly 200 may comprise part of any type of computing system, such as a hand-held computing system (e.g., a cell phone, smart phone, music player, etc.), mobile computing system (e.g., a laptop, nettop, tablet, etc.), a desktop computing system, or a server. In one embodiment, the assembly 200 comprises a solid-state drive (SSD).

The embodiments described herein provide improvements in cross talk reduction and impedance matching. Embodiments include a single optimal socket design that caters to both DDR and PCIe. By optimizing variables involved in the socket design, such as housing height, cantilever beam design, pin structure, housing structure, the hybrid socket structures described herein enable the use of a single socket design for both DDR and PCIe links to provide optimal impedance match for all IO's, as well as minimizing cross talk between socket pins.

The embodiments provide a hybrid design for a microelectronic socket, such as a land grid array (LGA) socket, that addresses the diverse requirements for single ended as well as differential ended interconnects. The electrical targets to meet DDR are typically specified in terms of crosstalk levels, and electrical performance targets for PCIe are typically defined in terms of impedance loss characteristics. The socket structures provided herein are optimized to meet both DDR and PCIe performance targets closely, and can be obtained by optimizing such parameters as electrical length/height scaling, contact design optimization, housing design optimization, and metal plating/shielding optimization.

While the metal plating for DDR interface can be optimized to improve shielding between adjacent socket signal pins, in some embodiments the plating provided herein for a PCIe interface is optional and can be optimized to better match the impedance to the nominal value for the PCIe differential ended channel link. The embodiments provide a basic socket housing and pin structure common to both PCIe and DDR interfaces to avoid increasing the cost and complexity of platform design, wherein the socket may be tuned/optimized by adding the metal plating around and inside the housing cavity separately to meet demands for both the DDR and PCIe channel links.

As the signal speeds and demand for smaller form factors are increasing with time, socket pin to pin cross talk mitigation becomes critical to enable these features. The embodiments herein address the demands driven by both DDR and PCIe signaling simultaneously by using the same geometrical structure for the socket housing and contact pin. This allows for single socket technology for the platform, which facilitates inventory management, complexity and design. From a performance perspective, the embodiments solve the differential impedance match challenges by tuning the plating of the socket design provided herein. At the same time, the plating is optimized differently to meet the cross talk for single ended buses such as DDR. The embodiments have application to any package to board connections via a socket structure, such as LGA socket based interconnects, memory, boards, multi-chip 3D package including CPU in combo with other devices. The embodiments enable server applications including such high speed I/O technologies such as DDR5 and PCIe G5. The embodiments enable continuation in socketable solutions to provide customers with requiring flexibility in customer inventory control and late design change accommodation.

Figure 3A:
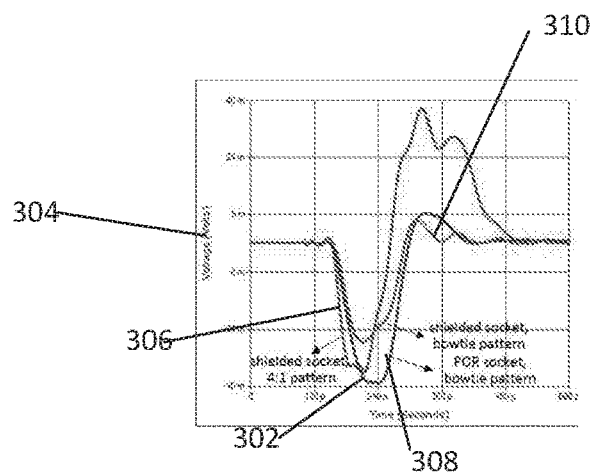
FIGS. 3a-3c represent graphs of electrical performance according to embodiments.
Figure 3B:
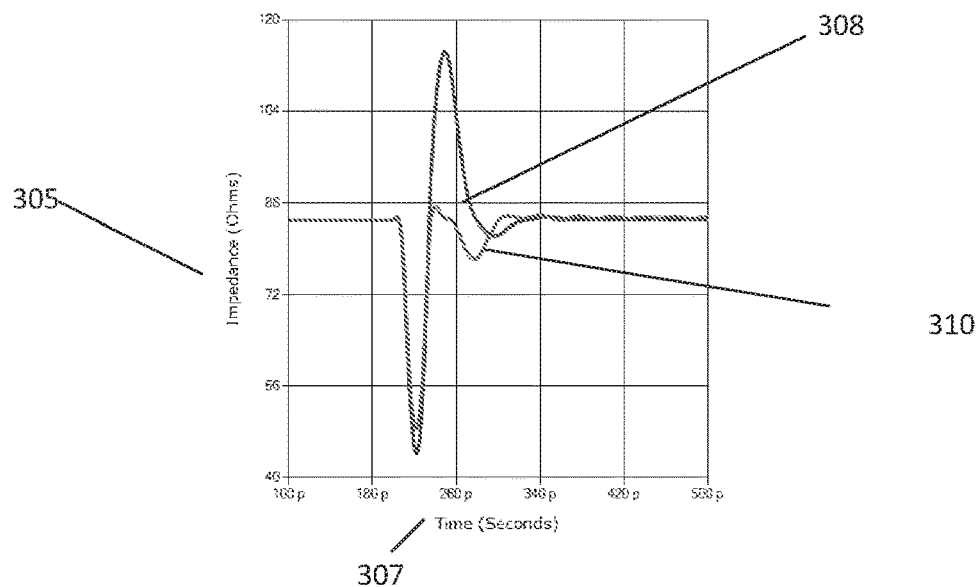
Figure 3C:
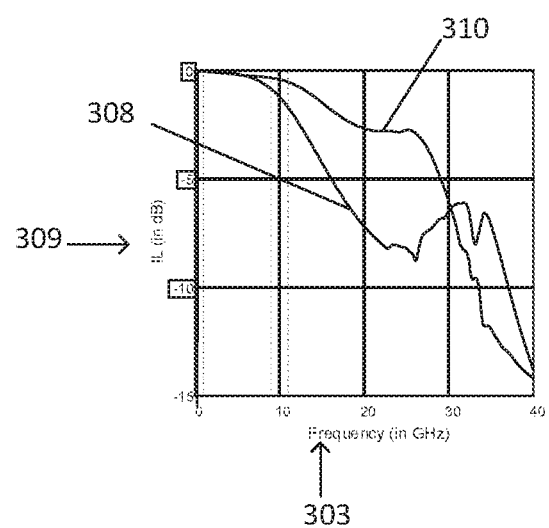

FIGS. 3a-3c depict graphs of electrical performance of a package system, such as the package assembly/system 200 for example, utilizing the socket structures of the embodiments herein. In FIG. 3a, socket performance in a region with unit to unit shielding for DDR was compared to prior art, non-optimized socket design in terms of cross talk as observed for the vertical link including several layers of a package, the socket interconnect, and plated hole vias of a board, for example. Voltage (mv) 304 was plotted against time in picoseconds (302). Two patterns representing conservative bowtie patterns, one with non-optimized, prior art socket 308, and an optimized socket 310 according to embodiments, are depicted.

An aggressive signal:ground pin ratio equal to about 4:1 optimized socket pattern 306 is depicted as well. Vertical transitions in channels generally have inductively dominant crosstalk, which becomes worse for aggressive patterns. Therefore, in the case of the 4:1 pattern with the optimized socket 306 according to the embodiments herein, coupled via technology was used to mitigate the crosstalk at the package vias, socket and board plated through holes (PTH). A step 1V magnitude with a rise time of 100 ps was used to compute the far end cross talk (FEXT), as plotted in FIG. 3a. When the same pin pattern is used for both sockets, it is observed that the shielded socket 306 gives −12 mV lower FEXT. When the 4:1 pattern is used for shielding the socket, slightly better performance is achieved as compared to the prior art socket 308, but it leads to pin count saving. Note that this also includes some compensation of cross talk at package level coming from using the coupled via technology. This can be used either for performance and/or pin count saving purpose driven by DDR.

For the PCIe case, on the other hand, the addition of the metal plating can be introduced or stripped inside and around the housing in a way to bring the impedance close to nominal value. For example, the socket with metal shield used for the results shown in FIG. 3a was modified by depopulating some of the shielding features to tune the impedance. It was found that simply introducing the plating in the housing minimized the impedance discontinuity. FIG. 3b shows the time domain reflectometry (TDR) impedance 305 measured through time 307 for a differential pair of socket pins. The profile 310 is for the hybridized socket of the embodiments herein, wherein the plating is optimized for a PCIe interface, and the prior art socket 308 is shown.

The impedance discontinuity caused by the socket, such as the socket of FIG. 1a, for example, was reduced from 113 Ohm to 87 ohm with the 85 ohm nominal impedance target for the optimized socket 310 of the embodiments. FIG. 3c shows insertion loss 309 for a differential pair of socket pins for various frequencies in GHz 303. The socket profile 310 for the optimized socket of the embodiments herein, as compared with the prior art socket 308, is depicted. The optimized socket profile 310 shows the impedance improvement, wherein the insertion loss can be reduced by more than about 60 percent at 16 GHz at the PCIe G5 Nyquist frequency, which provides a very promising solution.

The prior art profile 308 depicts the impedance loss for a prior art socket structure (referring back to FIG. 3b). The first dip observed in FIG. 3b is a result of the capacitive coupling between a LGA pad and a package bottom layer. The socket shows a high impedance that must be lowered to match the nominal value. This can be achieved by either reducing the socket inductance or increasing the socket capacitance. Some of the geometrical features/factors that can be tuned to optimize the socket design for both DDR and PCIe interfaces are listed herein.

Housing geometry: the dielectric height H (as shown in FIG. 2, for example) can be reduced for socket pin to pin cross talk mitigation. This also lowers both the socket inductance and the socket capacitance. An optimal housing height can be used to achieve better impedance matching. Housing material: One of the commonly adopted high-performance materials for socket housing is liquid crystal polymer (LCP) which is an injection molded plastic. The choice of a housing dielectric material(s) includes those materials that comprises high permittivity, while maintaining low dielectric loss, which allows for increasing the capacitance for impedance balance purposes. Contact pin: the cantilever beam portion of the contact pin (see cantilever beam portion 112' of FIG. 1a, for example) can be widened, and the vertical part of the pin (pin portion 112' of FIG. 1a, for example) that is enclosed by the housing can be modified to add metal plating, in order to lower the socket impedance. Thus, the socket loss characteristics of the socket structures of the embodiments herein may be optimized.

Metal plating: This feature can be optimized separately for the DDR and PCIe case. For the DDR case, metal may be added to provide shielding between socket pins, and/or to provide good electrical connection between ground pins. The conductive metal/shield features at both the top and bottom of the socket contacts may be added according to optimization requirements. The pin to pin shielding is achieved by plating the isolation features such as forming metal on the housing cavity wall and/or forming through vias structures adjacent the pin structure (as is shown in FIG. 1a, for example).

Figure 4:
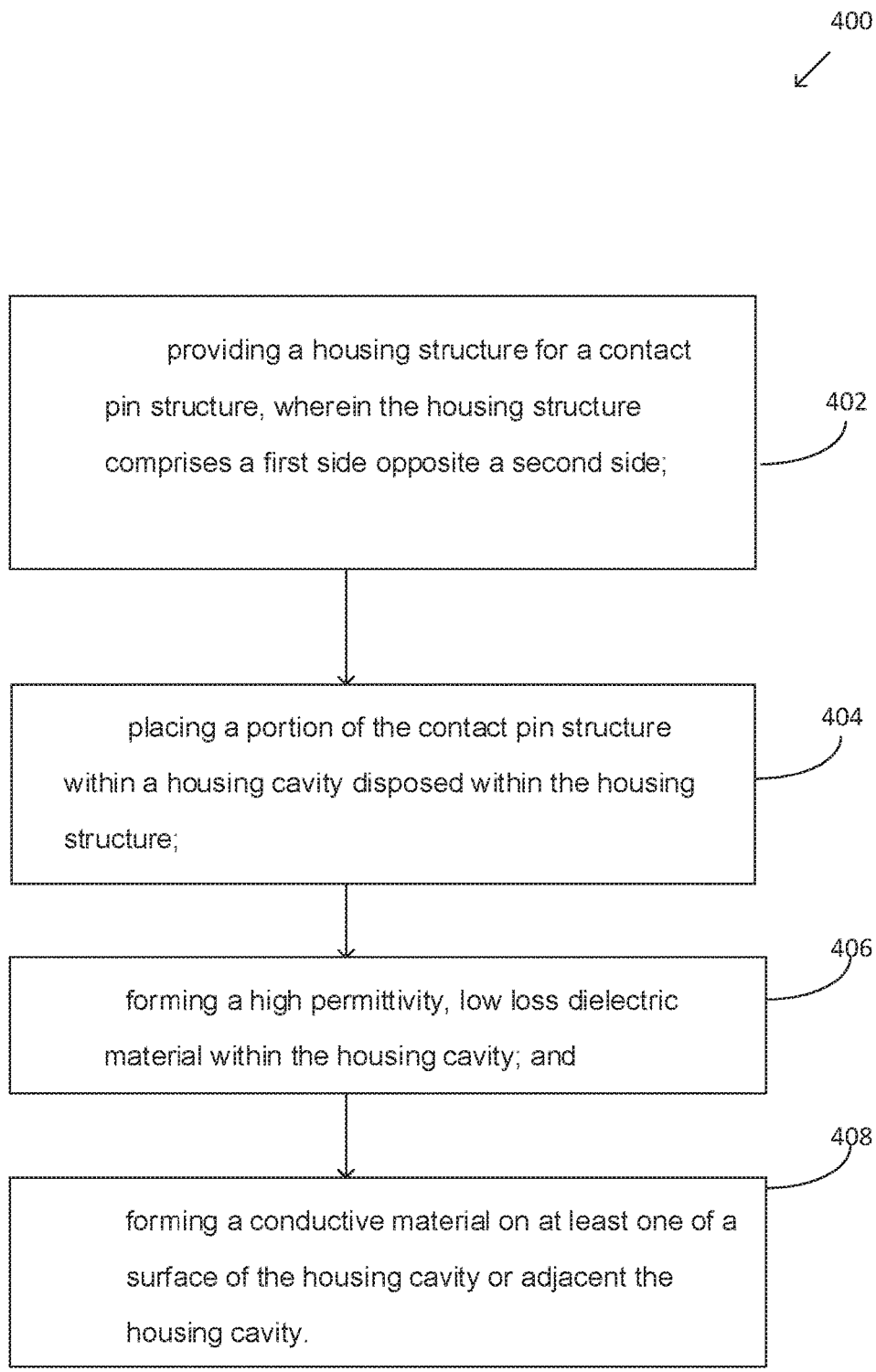
FIG. 4 represents a flow chart of a method of forming package structures according to embodiments.

FIG. 4 depicts a method 400 of optimizing the above factors/features, according to embodiments herein. It will be understood that the factors can be optimized for each specific application, according to the particular design specifications required. At step 402, a housing structure is provided for a contact pin structure, wherein the housing structure comprises a first side opposite a second side. The contact pin structure may further comprise a pin portion and a cantilever beam portion. In an embodiment, the cantilever beam portion may comprise a variety of widths (that are compliant with the pitch based electrical and mechanical constraints), such as between about 10 percent to about 50 percent of the pin pitch, which may be varied in order to optimize DDR and/or PCIe applications. At step 404, at least a portion of the contact pin structure may be placed within a housing cavity disposed within the housing structure. The housing structure may comprise a plurality of housing cavities, wherein a plurality of socket structures may be placed in individual housing cavities.

At step 406, a high permittivity, low loss dielectric material may be formed within the housing cavity. In an embodiment, the housing structure may comprise a high permittivity, low dielectric loss material as well, and may or may not comprise the same material as the low loss, high permittivity material disposed within the housing cavity. In an embodiment, a height of the housing structure comprising a dielectric material may be formed/selected such that socket pin to pin cross talk between a plurality of individual sockets disposed within the housing structure (such as the plurality depicted in FIG. 2, for example), may be reduced and/or optimized. Optimizing the housing height may reduce the socket inductance and the socket capacitance, as well as achieving superior impedance matching.

At step 408, a conductive material may be formed on at least one of the housing structure surfaces or adjacent the housing cavity. In addition, the conductive material/plating can be used to separately optimize DDR or PCIe cases. For DDR, metal may be formed to provide shielding between pins of the socket, and may provide good electrical connection between ground pins and shield features at both the top portion of the housing and the bottom portion of the housing structure. The pin to pin shielding may be achieved by adding conductive material/conductive plating on surfaces of the housing cavity and/or adjacent to the housing cavity. The conductive material added adjacent to the housing cavity may comprise conductive vias, in an embodiment.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultramobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
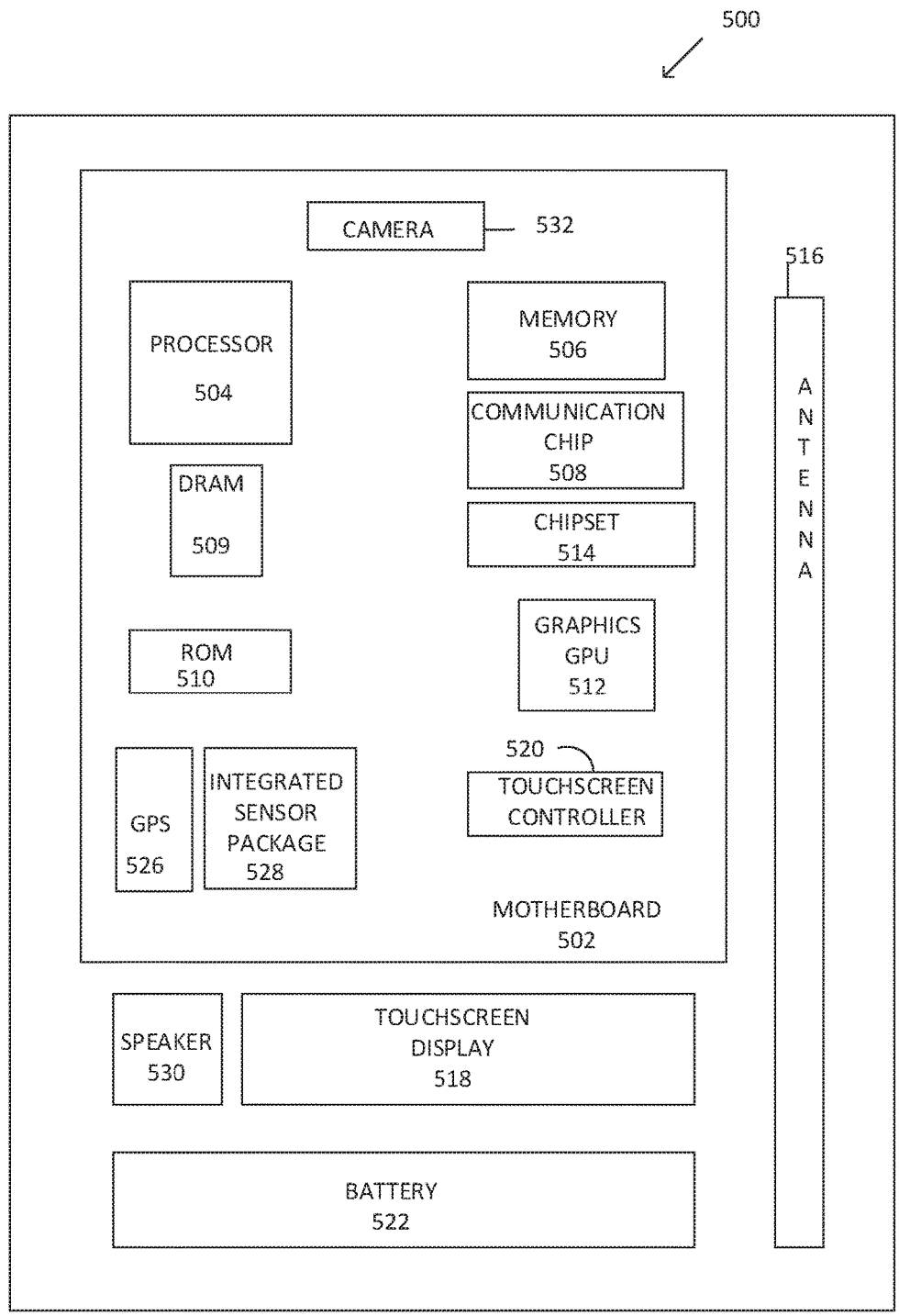
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, package structures/assemblies, such as is depicted in FIG. 2, for example, wherein a hybrid socket structure may be optimized for impedance and/or cross talk specifications. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising: a conductive pin comprising: a cantilever beam portion physically coupled with a first side of a package substrate; a contact pin portion, wherein a terminal end of the contact pin portion is physically and electrically coupled to a board; a housing structure comprising a housing cavity, wherein the contact pin portion is disposed at least partially within the housing cavity; and a conductive material disposed adjacent a surface of the housing cavity.

Example 2 includes the microelectronic package structure of example 1, wherein the conductive material comprises a conductive via disposed adjacent the housing cavity.

Example 3 includes the microelectronic package structure of example wherein the housing structure comprises a conductive material disposed on a sidewall of the housing structure.

Example 4 includes the microelectronic package structure of example 1 further comprising a conductive material disposed on a first side of the housing structure.

Example 5 includes the microelectronic package structure of example 1 further comprising a conductive material disposed on a second side of the housing.

Example 6 includes the microelectronic package structure of example 1 wherein the housing structure comprises a dielectric material comprising a high permittivity, low dielectric loss material.

Example 7 includes the microelectronic package structure of claim 6 wherein the dielectric material is selected from the group consisting of liquid crystal polymer materials.

Example 8 includes the microelectronic package structure of claim 1 wherein the socket comprises a peripheral component interconnect express (PCIe) socket, and the substrate includes a dynamic data rate (DDR) memory die.

Example 9 is a method of forming a microelectronic package structure comprising: providing a housing structure for a conductive pin, wherein the housing structure comprises a first side opposite a second side; placing a portion of the conductive pin within a housing cavity disposed within the housing structure; forming a high permittivity, low loss dielectric material within the housing cavity adjacent to the conductive pin; and forming a conductive material on at least one of a surface of the housing cavity or on a surface of the housing structure.

Example 10 includes the method of forming the microelectronic package structure of example 9 further comprising physically coupling a cantilever beam portion of the conductive pin to a first side of a package substrate, and physically coupling a terminal end of the conductive pin beam to a board.

Example 11 includes the method of forming the microelectronic package structure of example 9 further comprising forming a conductive material on the first side of the housing structure.

Example 12 includes the method of forming the microelectronic package structure of example 9 further comprising forming a conductive material on the second side of the housing structure.

Example 13 includes the method of forming the microelectronic package structure of example 9 further comprising wherein the housing structure comprises the high permittivity, low loss dielectric material.

Example 14 includes the method of forming the microelectronic package structure of example 10 wherein providing the housing structure comprises providing the housing structure comprising a height to reduce an impedance of the package structure.

Example 15 includes the method of forming the microelectronic package structure of example 9 further comprising forming a conductive material on sidewalls of the housing structure.

Example 16 includes the method of forming the microelectronic package structure of example 10, wherein the package substrate further comprises a DDR memory, and the socket comprises a PCIe socket.

Example 17 is a microelectronic system, comprising: a package substrate comprising at least one die; a socket structure physically and electrically coupled to the at least one die, wherein the socket structure comprises: a cantilever beam physically coupled with a first side of the package substrate; a contact pin physically coupled with the cantilever beam, wherein the contact pin is disposed at least partially within a housing cavity of a housing structure; a conductive material disposed adjacent a surface of the housing cavity; and a terminal end of the contact pin physically coupled with a board.

Example 18 includes the microelectronic system of example 17 wherein the socket structure comprises a portion of an LGA socket.

Example 19 includes the microelectronic system of example 17 wherein the at least one die comprises a DDR memory die.

Example 20 includes the microelectronic system of example 17 wherein the system includes a PCIe interface.

Example 21 includes the microelectronic system of example 17 wherein the system includes a DDR interface.

Example 22 includes the microelectronic system of example 20 wherein the system comprises a high speed single ended interconnect.

Example 23 includes the microelectronic system of example 17 wherein the system comprises a differential ended interconnect.

Example 24 includes the microelectronic system of example 17 wherein the system is capable of providing data rates greater than about 2.0 GB/link.

Example 25 includes the microelectronic package system of example 17 wherein the conductive material comprises a conductive plated material.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus, the embodiments are not limited to the structures described herein.

What is claimed is:

1. A microelectronic package socket structure comprising:
   a conductive pin comprising:
      a first portion, wherein the first portion comprises a cantilever beam, wherein the cantilever beam is physically coupled with a first side of a package substrate; and
      a second portion, wherein the second portion comprises a contact pin, wherein a terminal end of the contact pin portion is physically and electrically coupled to a board, wherein the first portion and the second portion are in direct physical contact and are physically continuous with each other;
   a housing structure, wherein the housing structure comprises a housing cavity, wherein the second portion of the conductive pin is within the housing cavity;
   a solder ball directly on the terminal end of the contact pin portion, wherein the solder ball is at least partially within the housing cavity; and a conductive material, wherein the conductive material is on a sidewall of the housing cavity.

2. The microelectronic package socket structure of claim 1, wherein the conductive material comprises one of a plated copper material or a conductive via.

3. The microelectronic package socket structure of claim 1 wherein the conductive material is on at least a portion of a sidewall of the housing structure.

4. The microelectronic package socket structure of claim 3 wherein the conductive material is on a first side of the housing structure, adjacent the first portion of the conductive pin.

5. The microelectronic package socket structure of claim 4 wherein the conductive material is on a second side of the housing structure, wherein the second side is opposite the first side of the housing structure.

6. The microelectronic package socket structure of claim 1 wherein the housing structure comprises a high permittivity, low dielectric loss material.

7. The microelectronic package socket structure of claim 1 wherein the housing structure comprises a liquid crystal polymer materials.

8. The microelectronic package socket structure of claim 1 wherein the socket comprises a peripheral component interconnect express (PCIe) socket, and the package substrate includes a dynamic data rate (DDR) memory die.

9. A method of forming a microelectronic package socket structure comprising:
providing a housing structure for a conductive pin, wherein the housing structure comprises a first side and an opposing second side, and wherein the housing structure comprises a housing cavity;
placing a contact pin portion of the conductive pin within the housing cavity,
wherein a terminal end of the contact pin is placed directly onto a solder ball,
wherein the solder ball is at least partially within the housing cavity; and;
attaching a cantilever beam portion of the conductive pin to a package substrate, wherein the cantilever beam portion and the contact pin portion are in direct physical contact and are physically continuous with each other; and
forming a conductive material on at least one of a sidewall of the housing structure or a sidewall of the housing cavity.

10. The method of forming the microelectronic package socket structure of claim 9 wherein placing the terminal end of the contact pin directly on the solder ball further comprises placing the solder ball onto a board.

11. The method of forming the microelectronic package socket structure of claim 9 further comprising forming a conductive material on the first side of the housing structure.

12. The method of forming the microelectronic package socket structure of claim 9 further comprising forming a conductive material on the second side of the housing structure.

13. The method of forming the microelectronic package socket structure of claim 9 further comprising wherein the housing structure comprises a high permittivity, low loss dielectric material.

14. The method of forming the microelectronic package socket structure of claim 10 wherein a height of the housing structure is selected to reduce an impedance of the package structure.

15. The method of forming the microelectronic package socket structure of claim 9 wherein an additional housing cavity is adjacent the housing cavity, wherein the additional housing cavity comprises an additional conductive pin, and further comprising forming a conductive material on a sidewall of the additional housing cavity.

16. The method of forming the microelectronic package socket structure of claim 10, wherein the package substrate further comprises a DDR memory, and the socket comprises a PCIe socket.

17. A microelectronic system, comprising:
a package substrate comprising one or more die;
a socket structure physically and electrically coupled to the one or more die, wherein the socket structure comprises:
a conductive pin comprising:
a first portion, wherein the first portion comprises a cantilever beam, wherein the cantilever beam is physically coupled with a first side of a package substrate; and
a second portion, wherein the second portion comprises a contact pin, wherein a terminal end of the contact pin portion is physically and electrically coupled to a board, wherein the first portion and the second portion are in direct physical contact and are physically continuous with each other;
a housing structure, wherein the housing structure comprises a housing cavity, wherein the second portion of the conductive pin is within the housing cavity;
a solder ball, wherein the solder ball is directly on the terminal end of the contact pin portion, wherein the solder ball is at least partially within the housing cavity; and
a conductive material on a sidewall of the housing cavity.

18. The microelectronic system of claim 17 wherein the socket structure comprises a portion of a land grid array (LGA) socket.

19. The microelectronic system of claim 17 wherein the at least one die comprises a DDR memory die.

20. The microelectronic system of claim 17 wherein the system includes a PCIe interface.

21. The microelectronic system of claim 17 wherein the system includes a DDR interface.

22. The microelectronic system of claim 20 wherein the system comprises a high speed single ended interconnect.

23. The microelectronic system of claim 17 wherein the system comprises a differential ended interconnect.

24. The microelectronic system of claim 17 wherein the system is capable of providing data rates greater than about 2.0 GB/link.

25. The microelectronic package system of claim 24 wherein the conductive material comprises a conductive plated material, and wherein the solder ball is directly on the board.

* * * * *